United States Patent [19]

Tashiro

[11] Patent Number: 4,952,028
[45] Date of Patent: Aug. 28, 1990

[54] METHOD FOR DRIVING AN OPTOELECTRONIC SWITCHING DEVICE

[75] Inventor: Yoshiharu Tashiro, Tokyo, Japan

[73] Assignee: NEC Corporation, Tokyo, Japan

[21] Appl. No.: 385,744

[22] Filed: Jul. 27, 1989

[30] Foreign Application Priority Data

Jul. 27, 1988 [JP] Japan .............................. 63-188756

[51] Int. Cl.$^5$ ........................................ G02B 26/00
[52] U.S. Cl. ................................. 350/320; 250/213 A
[58] Field of Search ................. 350/320, 355; 357/38; 250/213 A

[56] References Cited

U.S. PATENT DOCUMENTS 3,461,297  8/1969  Yarborough et al. .......... 250/213 A
4,650,285  3/1987  Stevenson ......................... 350/320

Primary Examiner—Bruce Y. Arnold
Assistant Examiner—Tho Van Tran
Attorney, Agent, or Firm—Sughrue, Mion, Zinn, Macpeak & Seas

[57] ABSTRACT

A method for driving an optoelectronic switching device such as a pnpn semiconductor device comprises applying a predetermined biased voltage to the optoelectronic semiconductor device, and supplying plural light inputs to the optoelectronic semiconductor device to which the predetermined biased voltage is applied. The plural light inputs are supplied to the optoelectronic semiconductor device intermittently with a predetermined period before carriers excited by a first input pulse of the plural light inputs become extinct. As a result, the number of light sources is decreased.

2 Claims, 4 Drawing Sheets

FIG. I PRIOR ART

METHOD FOR DRIVING AN OPTOELECTRONIC SWITCHING DEVICE

FIELD OF THE INVENTION

The invention relates to a method for driving an optoelectronic switching device, and more particularly to a method for controlling an optoelectronic switching device which is used for an optical logic circuit, an optical memory, an optical measurement system, etc. to be turned on and off.

BACKGROUND OF THE INVENTION

An optoelectronic switching device having a function in which the internal state is changed by a light information signal of a small energy, and the light information is stored is an indispensable device for a parallel information processing system, an optical switching system, an optical measurement system, etc. Such an optoelectronic switching device is described on pages 596 to 600 of "Journal of Applied Physics, 59(2), 15, Jan. 1986." This optoelectronic switching device is a pnpn thyristor structure, and comprises an anode layer of p-AlGaAs, a cathode layer of n-AlGaAs, an n-gate layer of n-GaAs, and a p-gate layer of p-GaAs, wherein bandgap energies of the n- and p-gate layers are narrower than those of the anode and cathode layers, and the n- and p-gate layers are sandwiched by the anode and cathode layers.

The pnpn thyristor device is changed from the high impedance state to the low impedance state in accordance with its turning-on. In this low impedance state, carriers are mainly injected into the n-gate layer and confined therein, because the gate layers are formed by semiconductors having the bandgap energies narrower than those of the anode and cathode layers. As a result, light is emitted from the pnpn thyristor device. Although the p-gate layer is of a high concentration and a thin film in the pnpn thyristor device to improve the light emitting efficiency and the light emitting sensitivity, this pnpn thyristor device is basically a pnpn semiconductor device.

Such a pnpn semiconductor device is turned on to shift from the high impedance state to the low impedance state in accordance with an applied voltage which is more than a switching voltage Vs. This switching voltage Vs shifts in a direction of a low voltage in accordance with an input light incident to the pnpn semiconductor device. The shifted switching voltage is indicated by Vss hereinafter. Once the pnpn semiconductor device is turned on in accordance with the input light incident thereto and the shifted switching voltage Vss applied thereto, it remains turned on even after the shutting-off of the input light. The low impedance state is held by applying a holding voltage lower than the shifted switching voltage to the pnpn semiconductor device, and reset by applying a resetting voltage lower than the holding voltage to the pnpn semiconductor device. Therefore, the pnpn semiconductor device can be used for an optical memory device.

As understood from the above, this pnpn semiconductor device is turned on by an incident light having a predetermined light amount in the state that a predetermined switching voltage Vss is applied to the pnpn semiconductor device. Therefore, a logic circuit such as "AND", "OR", etc. is realized by controlling the light amount of the incident light, so that various logic calculations are carried out by combining the logic circuits.

In fabricating an AND circuit, for instance, two pulse light signals A and B are supplied to the pnpn semiconductor device simultaneously. In this case, a total energy of the two pulse light signals A and B is a level by which the pnpn semiconductor device is turned on in the state that a predetermined switching voltage Vss is applied thereto, although the pnpn semiconductor device is not turned on due to the shortage of the light energy, where at least one of the two pulse light signals A and B is not applied thereto. The state of the low impedance in which the pnpn semiconductor device is turned on by receiving the two pulse light signals A and B is held therein by applying a predetermined voltage slightly higher than a holding voltage Vh and lower than the switching voltage Vss to the pnpn semiconductor device. Then, the switching voltage Vss which is a reading-out voltage is applied to the pnpn semiconductor device, so that a pulse light signal C is emitted from the pnpn semiconductor device in accordance with the turning-on state. On the other hand, the pulse light signal C is not obtained from the pnpn semiconductor device, where at least one of the two pulse light signals A and B is not applied to the pnpn semiconductor device, so that the low impedance state is not obtained therein. As a result, the following truth table which corresponds to a calculation in the AND circuit is obtained.

| INPUT | | OUTPUT |
|---|---|---|
| A | B | C |
| 1 | 1 | 1 |
| 1 | 0 | 0 |
| 0 | 1 | 0 |
| 0 | 0 | 0 |

However, a conventional method for driving an optoelectronic switching device has a disadvantage in that plural light sources are necessary to provide a logic circuit, as described above in the case where the pnpn semiconductor device is turned on and off to realize the AND circuit. Therefore, where a predetermined number of the pnpn semiconductor devices are integrated in a predetermined area to carry out an optical parallel calculation, the integration circuit density is hard to be increased in the areal view point. A further disadvantage is that the optical alignment of optical systems for supplying plural input light signals to the pnpn semiconductor devices and receiving plural output light signals therefrom is difficult, and the number of power supplies is inevitably increased to result in the difficulty of controlling the timings of the turning on and off.

SUMMARY OF THE INVENTION

Accordingly, it is an object of the invention to provide a method for driving an optoelectronic switching device in which a logic calculation such as an AND calculation is carried out by using a single light source.

It is a further object of the invention to provide a method for driving an optoelectronic switching device in which an integration density of optoelectronic switching devices and driving means for light sources is increased.

It is a still further object of the invention to provide a method for driving an optoelectronic switching device in which the alignment of optical systems and the timing control thereof become easy.

According to the invention, a method for driving an optoelectronic switching device comprising a step of radiating lights of a predetermined light energy at plural timings of time division to the optoelectronic switching device, to which a predetermined biased voltage is applied, in a time duration before the extinction of optically excited carriers. Then, the optoelectronic switching device is turned from the high impedance state to the low impedance state.

BRIEF DESCRIPTION OF DRAWINGS

The invention will be explained in more detail in conjunction with appended drawings, wherein.

DESCRIPTION OF PREFERRED EMBODIMENTS

Before explaining a method for driving an optoelectronic switching device in the embodiment according to the invention, the conventional method for driving an optoelectronic switching device will be explained in FIGS. 1 to 4.

Figure 1:
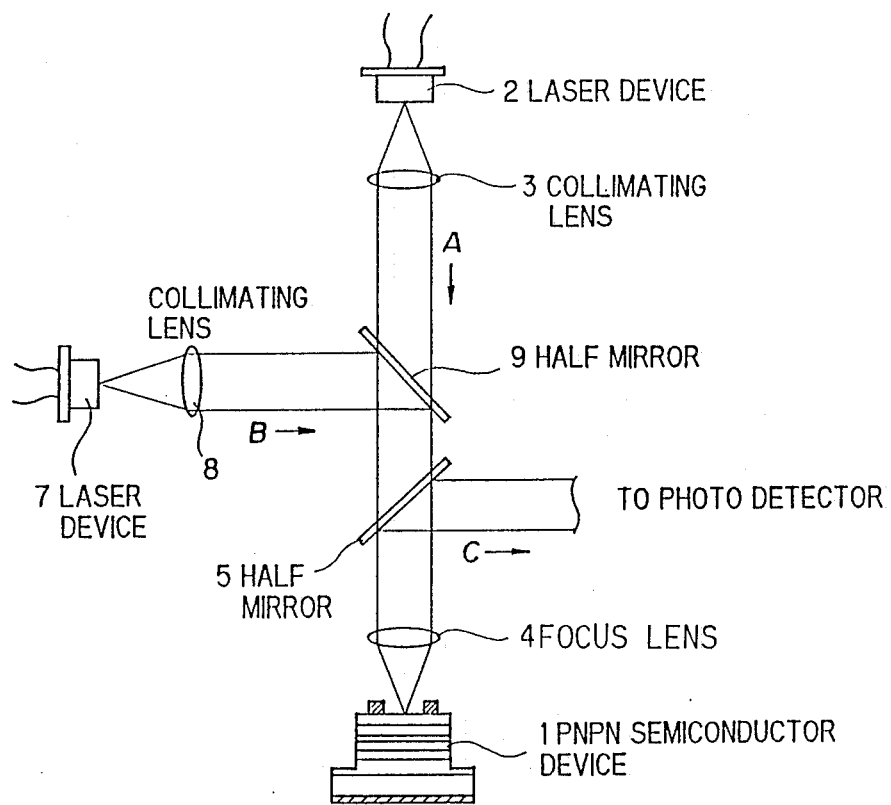
FIG. 1 is an explanatory view showing a conventional method for driving an optoelectronic switching device.

FIG. 1 shows a system which is applied to an AND circuit in the conventional method for driving the optoelectronic switching device. The system comprises a pnpn semiconductor device 1 which is the optoelectronic switching device, a first laser device 2 for emitting a light pulse signal $S_1$, a first collimating lens 3 for collimating light of the signal $S_1$, a focusing lens 4 for focusing light incident to the pnpn semiconductor device 1 thereon, a first half mirror 5 for reflecting light emitted from the pnpn semiconductor device 1 in a direction to a photodetector (not shown), a second laser device 7 for emitting a light pulse signal $S_2$, a second collimating lens 8 for collimating light of the signal $S_2$, and a second half mirror 9 for reflecting the light of the signal $S_2$ in a direction to the pnpn semiconductor device 1.

Figure 2:
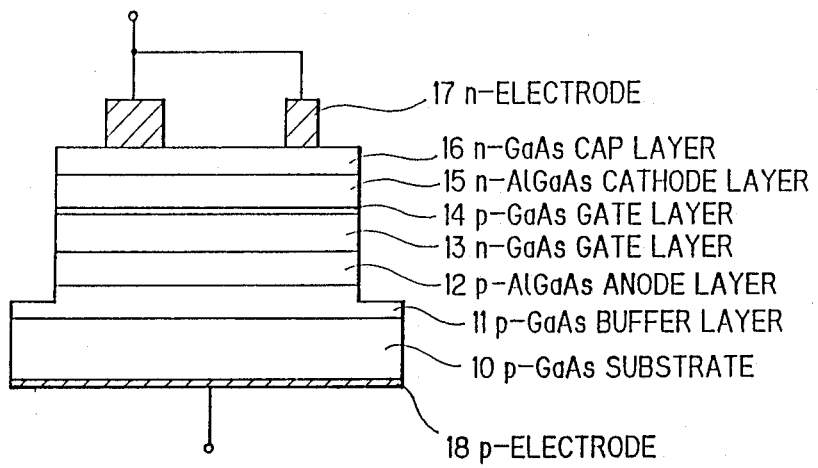
FIG. 2 is a cross sectional view showing the optoelectronic switching device used in FIG. 1.

FIG. 2 shows the pnpn semiconductor device 1 which is described on the aforementioned Journal of Applied Physics, and has a structure of a pnpn thyristor as described before. As illustrated in FIG. 2, the pnpn semiconductor device 1 comprises an anode layer 12 of p-AlGaAs and a cathode layer 15 of n-AlGaAs, and n- and p-gate layers 13 and 14 of n- and p-GaAs sandwiched by the anode and cathode layers 12 and 15, wherein bandgap energies of the n- and p-gate layers 13 and 14 are narrower than those of the anode and cathode layers 12 and 15. This multi-layer structure is provided on a buffer layer 11 of p-GaAs grown on a semiconductor substrate 10 of p-GaAs, and n-and p-electrodes 17 and 18 are provided on an n-GaAs cap layer 16 grown on the n-cathode layer 15, and on the back surface of the semiconductor substrate 10, respectively.

Figure 3:
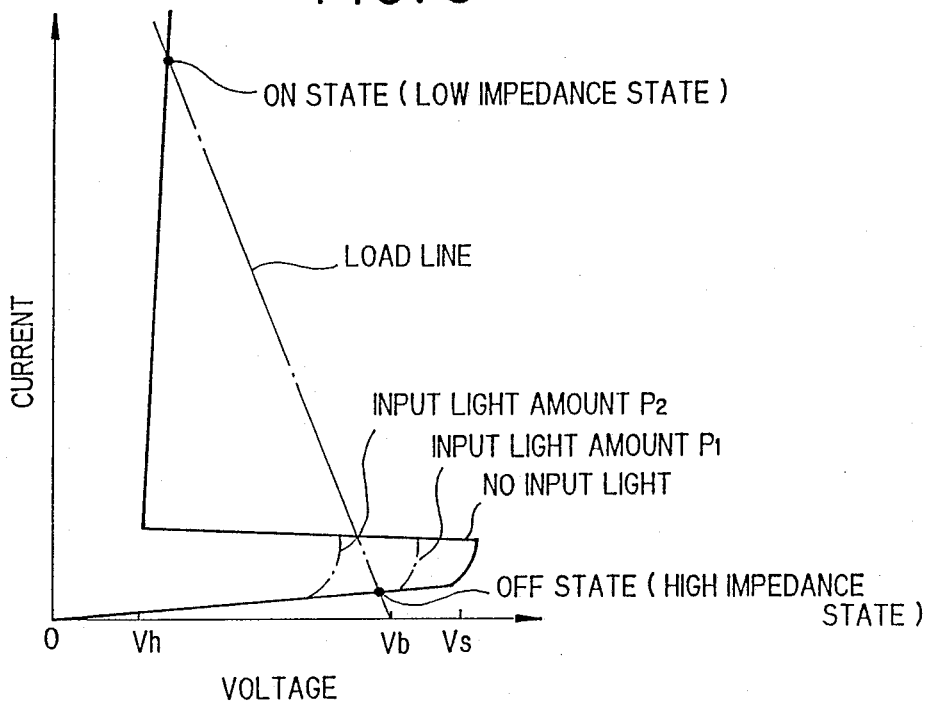
FIG. 3 is a characteristic diagram showing a current to voltage relation in the optoelectronic switching device which is to be turned on and off.

FIG. 3 shows a current to voltage characteristic of the pnpn semiconductor device 1 as illustrated in FIGS. 1 and 2. As shown therein, the high impedance state is changed to the low impedance state in the pnpn semiconductor device 1, where a switching voltage Vs is applied thereto, and the switching voltage Vs shifts in a direction of a low voltage as defined "the shifted switching voltage Vss" before, where light is incident to the pnpn semiconductor device 1 as shown by input light amounts $P_1$ and $P_2$ ($P_2 > P_1$). As understood from the current to voltage characteristic, the pnpn semiconductor device 1 is not turned on by a biased voltage Vb (Vb < Vs), where a light of the amount $P_1$ is incident thereto, while the pnpn semiconductor device 1 is turned on by the same biased voltage Vb, where a light of the amount $P_2$ is incident thereto. The ON state (the low impedance state) is not changed to the OFF state (the high impedance state), as long as a biased voltage applied thereto is higher than a holding voltage Vh. In other words, the pnpn semiconductor device 1 is turned off (is reset) from the ON state to the OFF state, where the biased voltage is decreased to be lower than the holding voltage Vh.

Figure 4A:
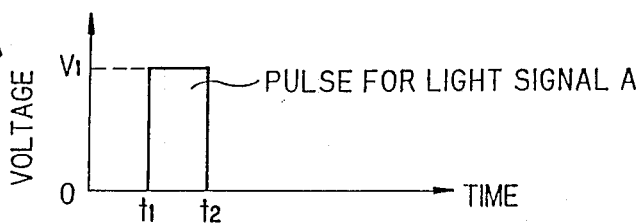
FIGS. 4A to 4C are timing charts showing operation in the conventional method for driving an optoelectronic switching device.
Figure 4B:
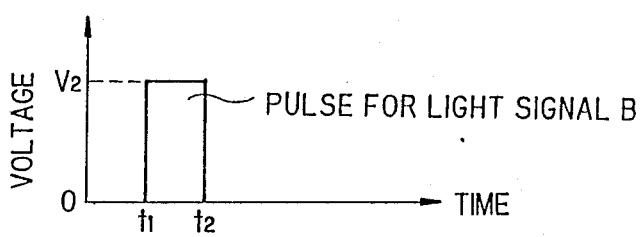
Figure 4C:
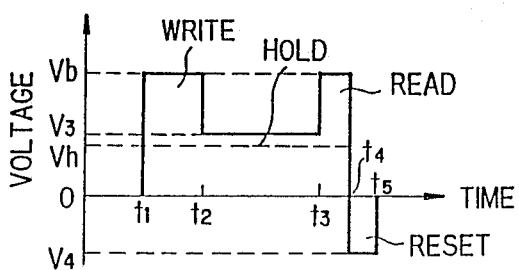

In operation, biased voltages $V_1$ and $V_2$ are applied to the laser devices 2 and 7, respectively, so that the light pulse signals A and B are supplied from the laser devices 2 and 7 to the pnpn semiconductor device 1 during times $t_1$ to $t_2$ as shown in FIGS. 4A and 4B. Here, it is assumed that a light amount of the light pulse signal A or B is less than the aforementioned input light amount $P_1$, and that a total light amount of the light pulse signals A and B is greater than the aforementioned input light amount $P_2$. Simultaneously, the biased voltage Vb is applied to the pnpn semiconductor device 1, so that the pnpn semiconductor device 1 is turned on to emit a light output C by receiving the light pulse signals A and B as shown in FIG. 4C. Thus, information of the light pulse signals A and B is written as "high" into the pnpn semiconductor laser device 1. Thereafter, the biased voltage Vb is decreased to be a biased voltage $V_3$ higher than the holding voltage Vh ($V_3 > $Vh), and the biased voltage $V_3$ is maintained to be applied to the pnpn semiconductor device 1 during times $t_2$ to $t_3$ as shown in FIG. 4C, so that the holding of the "high" state remains unchanged.

Then, a reading-out voltage equal to the biased voltage Vb is applied to the pnpn semiconductor device 1 during times $t_3$ to $t_4$ as shown in FIG. 4C, so that a light output C is emitted from the pnpn semiconductor device 1 and reflected by the half mirror 5. Thus, the light output C is detected by the photodetector (not shown), so that the information of the "high" state is read therefrom. The information of the "high" state is erased in the pnpn semiconductor device 1 by applying a resetting voltage $V_4$ thereto during times $t_4$ to $t_5$ as shown in FIG. 4C.

On the other hand, where at least one of the light pulse signals A and B is not supplied to the pnpn semiconductor device 1, the pnpn semiconductor device 1 is not turned on and remains in the low impedance state, even if the biased voltage Vb is applied to the pnpn semiconductor device 1 during the times $t_1$ to $t_2$. Therefore, the aforementioned truth table is obtained.

Next, an optical system applied to an AND circuit in a method for driving an optoelectronic switching device in the embodiment according to the invention will be explained in FIG. 5, wherein like parts are indicated by like reference numerals as used in FIG. 1.

The optical system of the embodiment is different from the optical system as shown in FIG. 1 in that the optical system of the embodiment does not includes the second laser device 7, the second collimating lens 8, and the second half mirror 9. In this optical system, a laser device 2 is driven by a driver 24 which is controlled by a control unit 23, and light reflected from a half mirror 5 is incident through a focusing lens 21 to a photo-transistor 22, whose current value is detected by a detector 25 which is connected to the control unit 23. A pnpn semiconductor device 1 has a characteristic in which it is turned on, where a light input of 3 pJ is supplied thereto in the state that a biased voltage Vb which is 95% of a switching voltage Vs is applied thereto.

Figure 6A:
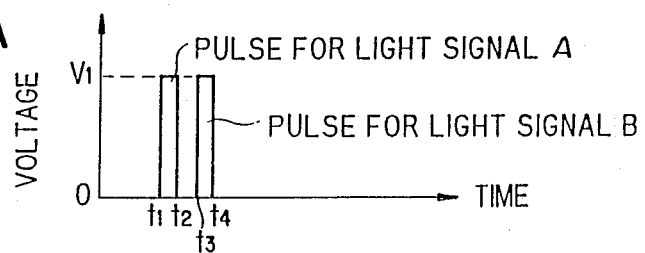
FIGS. 6A and 6B are timing charts showing operation in the method for driving an optoelectronic switching device in the embodiment according to the invention.
Figure 6B:
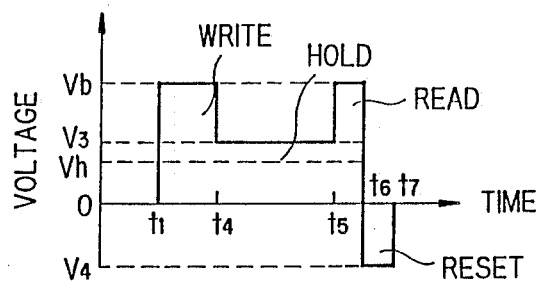

In operation, biased voltages $V_1$ are applied to the laser device 2 during times $t_1$ to $t_2$ (100 n sec) for the first time and during times $t_3$ to $t_4$ (100 n sec) for the second time as shown in FIG. 6A after an intermittent duration $t_2$ to $t_3$ (100 n sec), so that a first pulse light signal A having a light energy of 2 pJ, and a second pulse light signal B having the same light energy are supplied from the laser device 2 through the collimating lens 3, the half mirror 5, and the focusing lens 4 to the pnpn semiconductor device 1 synchronously with the two biased voltages $V_1$, respectively. Simultaneously, a biased voltage Vb of 0.95 Vs is applied to the pnpn semiconductor device 1 during times $t_1$ to $t_4$ (300 n sec). However, the pnpn semiconductor laser device 1 is not turned on only by receiving the first pulse light signal A, but turned on by receiving the first and second pulse light signals A and B, because the received light energy is totally 4 pJ which is over 3 pJ of a light energy required for the switching of the pnpn semiconductor laser device 1. Thereafter, a biased voltage $V_3$ slightly greater than a holding voltage Vh is applied to the pnpn semiconductor device 1 during times $t_4$ to $t_5$, and the biased voltage Vb which is a reading-out voltage is applied thereto to read information stored in the pnpn semiconductor device 1. At the stage of reading out the information, a light output C is supplied from the pnpn semiconductor device 1 to the half mirror 5, and thereby reflected to be supplied to the phototransistor 22, whose current value is detected by the detector 25. This case is that two inputs are "1" in the AND circuit, and an output is "1" therein.

A second case is that the first pulse light signal A is not supplied to the pnpn semiconductor device 1 during the times $t_1$ to $t_2$, but the second pulse light signal B is supplied thereto during the times $t_3$ to $t_4$. In this case, the pnpn semiconductor device 1 is not turned on, because a light input of 2 pJ which is less than the aforementioned switching light energy 3 pJ is only supplied to the pnpn semiconductor device 1.

A third case is that the first pulse light signal A is supplied to the pnpn semiconductor device 1, and the second pulse light signal B is not supplied thereto. In this case, the pnpn semiconductor device 1 is not turned on in the same reason as in the second case.

As a matter of course, where both of the first and second pulse light signals A and B are not supplied to the pnpn semiconductor device 1, the pnpn semiconductor device 1 is not turned on.

Figure 5:
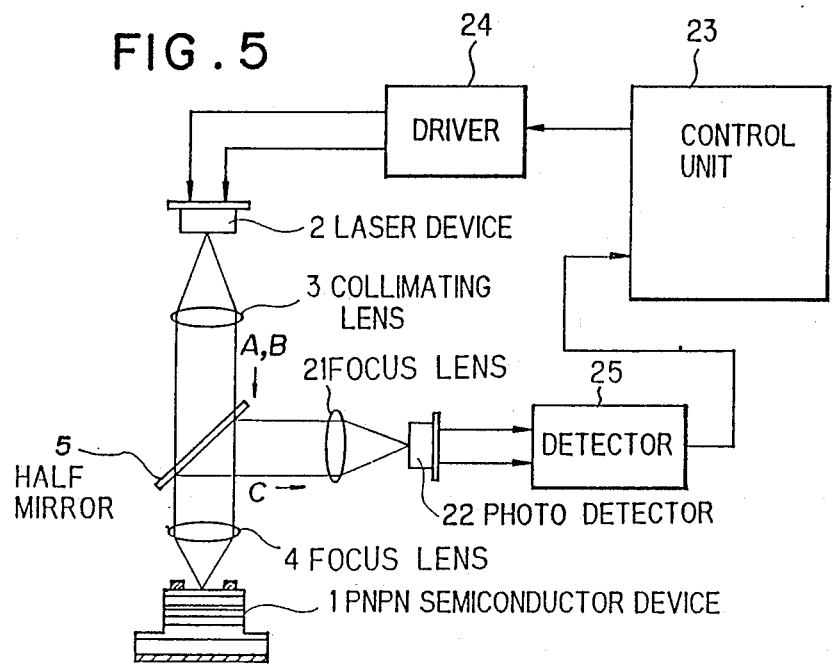
FIG. 5 is an explanatory view showing a method for driving an optoelectronic switching device in an embodiment according to the invention.

Consequently, an AND circuit is realized in the optical system as shown in FIG. 5, wherein only one light source is provided for one pnpn semiconductor device. This simplifies the optical alignment and a power supply system in the method for driving an optoelectronic switching device.

Figure 7:
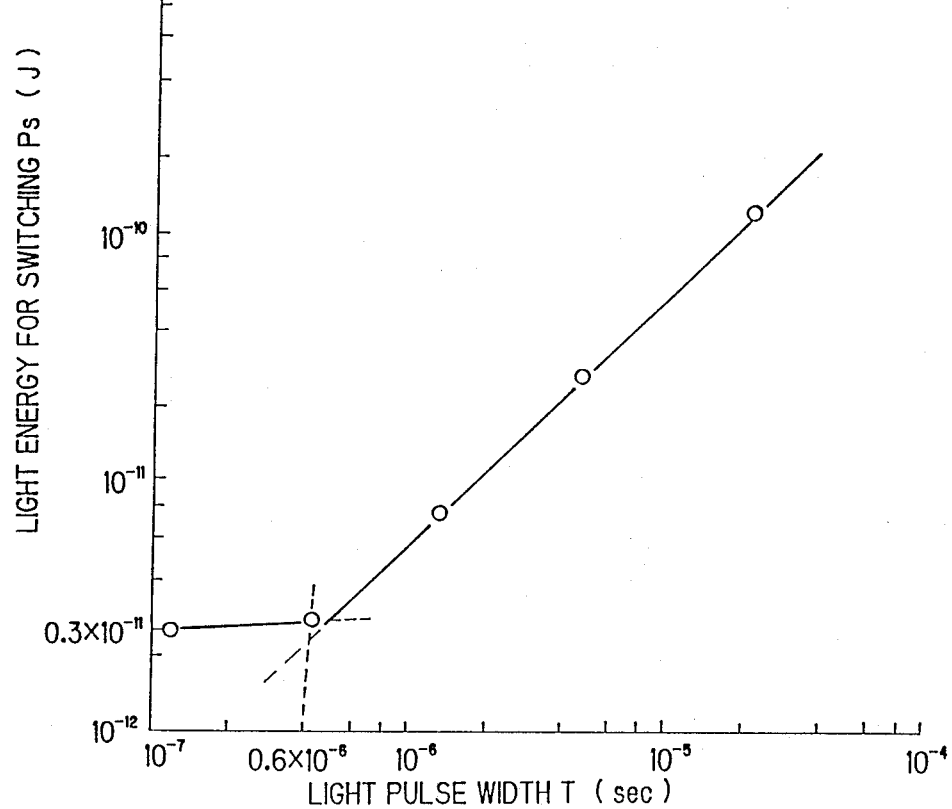
FIG. 7 is a graph showing a relation between a light energy and a pulse width of light radiated to the optoelectronic switching device used in FIG. 5.

In this embodiment, the biased voltages $V_1$ are applied to the pnpn semiconductor 1 during the two time durations $t_1$ to $t_2$ (100 n sec) and $t_3$ to $t_4$ (100 n sec) with the intermittent duration $t_2$ to $t_3$ (100 n sec). However, operation is not limited to these specific values. In this connection, the relation between a width T of a pulse light signal supplied to the pnpn semiconductor 1 and a light energy Ps required for turning the pnpn semiconductor device 1 on is shown in FIG. 7. The relation shows that the switching light energy Ps is constantly 3 pJ at the width T of less than 600 n sec, and it increases with an inclination of 1 in proportional to the width T at the width of over 600 n sec. This means that, where the pulse width T is less than 600 n sec, all carriers excited in the time by the pulse light contributes to the switching of the pnpn semiconductor device 1 without the extinction thereof. On the other hand, where the pulse width T is over 600 n sec, carriers excited by the prolonged pulse light become extinct partly due to the lapse of time. Therefore, all carriers do not contribute to the switching of the pnpn semiconductor device 1, so that the switching light energy Ps must be large at the width T of over 600 n sec. In other words, where the pulse width T is less than 600 n sec, it is not necessary to supply a light input to the pnpn semiconductor device 1 without intermittence, and to control a density of the light input to be a predetermined value. For this reason, the pnpn semiconductor device 1 is turned on from the high impedance state to the low impedance state, as long as a total light energy of the light input is over the switching light energy in 600 n sec in any form that the light input is continuous, intermittent, and so on.

Although the AND circuit is explained in the embodiment, the invention may be applied to a whole optical calculation including an AND calculation. As a matter of course, the number of light input signals is not limited to the two light input signals A and B, if the light input signals are supplied to an optoelectronic switching device before optically excited carriers become extinct.

Further, the invention may be applied to a device which shifts between the high and low impedance states, although the device radiates no light by itself. In such a case, a light emitting device is connected to the non-light emitting device in place of a load resistance, so that the light emitting device radiate light in accordance with current flowing through the non-light emitting device which is turned on to be in the low impedance state. If there is no need to obtain a light output, the switching between the high and low impedance states occurs is detected in accordance with a current value in the low impedance state. This modification can be applied to a counter for counting the number of pulses, among which a light energy of one pulse is known beforehand. Still further, the invention may be applied to the measurement in which a light power, a light energy, etc. of a continuous light (DC), periodically radiated light, etc. are detected.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for driving an optoelectronic switching device, comprising:
    applying a predetermined biased voltage to said optoelectronic switching device; and
    supplying plural light inputs to said optoelectronic switching device, intermittently with a predetermined period such that carriers excited by a first light input of said plural light inputs do not become extinct before the next pulse starts.

2. A method for driving an optoelectronic switching device, according to claim 1, wherein:
    said optoelectronic switching device is a pnpn semiconductor device which includes an anode layer of p-semiconductor, a cathode layer of n-semiconductor, and n- and p-gate layers sandwiched by said anode layer and said cathode layer;
    said plural light inputs are first and second light inputs, a total light energy of said first and second light inputs being over a switching light energy for turning said pnpn semiconductor device on, and a light energy of one light input selected from said first and second light inputs being less than said switching light energy.

* * * * *